(12) United States Patent
Chen et al.

(10) Patent No.: US 7,319,284 B2
(45) Date of Patent: Jan. 15, 2008

(54) SURFACE ACOUSTIC WAVE DEVICE AND METHOD FOR FABRICATING THE SAME

(75) Inventors: Jyh-Shin Chen, Hsin-Chu (TW); Sheng-Wen Chen, Chung Li (TW); Hui-Ling Kao, Chung Li (TW); Yu-Sheng Kung, Hsin-Chu (TW); Yu-Hsin Lin, Hsin-Chu (TW); Yi-Chiuen Hu, Hsin-Chu (TW)

(73) Assignee: Precision Instrument Development Center National Applied Research Laboratories, Hsin-Chu (TW)

( * ) Notice: Subject to any disclaimer, the term of this patent is extended or adjusted under 35 U.S.C. 154(b) by 0 days.

(21) Appl. No.: 11/219,459

(22) Filed: Sep. 2, 2005

(65) Prior Publication Data
US 2007/0052324 A1  Mar. 8, 2007

(51) Int. Cl.
*H01L 41/083* (2006.01)

(52) U.S. Cl. .................................. 310/313 R

(58) Field of Classification Search ............ 310/313 R, 310/313 B, 313 A, 313 C, 313 D
See application file for complete search history.

(56) References Cited

U.S. PATENT DOCUMENTS

| 6,236,141 | B1 * | 5/2001 | Sato et al. ............... 310/313 R |
| 6,437,479 | B1 * | 8/2002 | Miura et al. ............. 310/313 R |
| 2004/0007940 | A1 * | 1/2004 | Tsai et al. ............... 310/313 R |
| 2005/0067920 | A1 * | 3/2005 | Weinberg et al. ....... 310/313 R |
| 2006/0116585 | A1 * | 6/2006 | Nguyen-Dinh et al. ..... 600/459 |
| 2007/0019042 | A1 * | 1/2007 | Chung et al. ................. 347/68 |

* cited by examiner

*Primary Examiner*—Darren Schuberg
*Assistant Examiner*—Derek Rosenau
(74) *Attorney, Agent, or Firm*—Volpe and Koenig P.C.

(57) ABSTRACT

A novel surface acoustic wave device with a decreased velocity dispersion and a low insertion loss as well as the fabrication method therefor is provided. The surface acoustic wave device includes a substrate, an insulating layer with an indentation on the substrate, a silicon layer with a first portion on the insulating layer and a second portion suspended above the indentation, a piezoelectric layer on the first and the second portions of the silicon layer, and at least an electrode on the piezoelectric layer.

3 Claims, 6 Drawing Sheets

SURFACE ACOUSTIC WAVE DEVICE AND METHOD FOR FABRICATING THE SAME

FIELD OF THE INVENTION

The present invention relates to a surface acoustic wave device and a fabrication method therefor, in particular to a thin film surface acoustic wave device and a relevant fabrication method therefor.

BACKGROUND OF THE INVENTION

The bulk micromachining process is a common scheme adopted in the micro-electro-mechanical system (MEMS) application, whereby a specific and desired structure is achievable on a silicon substrate or a silicon-on-insulator (SOI) substrate by means of an etching procedure in the bulk micromachining process.

Regarding the so-called surface acoustic wave (SAW) device, it is now popularly applied in electric equipments such as the television and the video recorder. Particularly, the SAW device plays an important role in the high frequency wireless communication application due to the characteristics of miniature volume and low power loss.

Various bulk substrates of piezoelectric materials including $LiNbO_3$ and quartz are applicable to the SAW device. Nowadays, many efforts are done not only for achieving the decrement of fabrication cost for the SAW device and the improvement of applicable frequency therefor, but also for integrating the fabrication for the SAW device with the conventional integrated circuit (IC) production. As a result, it is a great tendency toward fabricating the thin film SAW device that provides a high wave velocity by means of a procedure integrated with the standard silicon process technology. In such an integrated procedure for fabricating the SAW device, the piezoelectric thin films such as aluminum nitrides, zinc oxides and lead zirconate titanates (PZT) are utilized. The mentioned piezoelectric thin films are advantageous in their respective excellent piezoelectric property, high electromechanical coupling coefficient and high surface acoustic wave velocity. In addition, such piezoelectric thin films are capable of being compatible with the existing process for the semiconductor. Regarding the fabrication for the high frequency SAW device, the difficult and complicated procedure of a sub-micron process is not necessary anymore if the mentioned piezoelectric thin films are applied, which is regarded as a benefit resulting from the high surface acoustic wave velocity owned by the mentioned piezoelectric thin films.

However, such a thin film surface acoustic wave device is disadvantageous in the velocity dispersion. It is known that the wave velocity of the device would be significantly affected by the thickness of the substrate. That is, the surface wave would be inversely influenced by the substrate since the piezoelectric thin film is much thinner with respect thereto, so that the insertion loss would be decreased.

In order to overcome the above drawbacks in the prior art, the present invention provides a novel surface acoustic wave device and a novel fabrication method therefor. The provided surface acoustic wave device is designed as a suspended structure so as to decrease the thickness of the substrate, and thereby the velocity dispersion effect of the surface acoustic wave device is reduced. Moreover, the decrement of the insertion loss is also achievable through the surface acoustic wave device of the present invention. Therefore, the provided surface acoustic wave device has a great potential for being polpularized.

SUMMARY OF THE INVENTION

It is a first aspect of the invention to provide a surface acoustic wave device with a decreased velocity dispersion and a lower insertion loss.

In accordance with the aspect, the surface acoustic wave device includes a substrate an insulating layer with an indentation on the substrate, a silicon layer with a first portion on the insulating layer and a second portion suspended above the indentation, a piezoelectric layer on the first and the second portions of the silicon layer and at least an electrode on the piezoelectric layer.

Preferably, the substrate is a silicon substrate.

Preferably, the insulating layer is a silica layer.

Preferably, the first and the second portions of the silicon layer are separated by an etched window.

Preferably, the electrode is a metallic and interdigital-shaped electrode.

It is a second aspect of the present invention to provide a method for fabricating a surface acoustic wave device with a decreased velocity dispersion and a lower insertion loss.

In accordance with the aspect, the method includes steps of (a) providing a substrate, (b) forming an insulating layer on the substrate, (c) forming a silicon layer on the insulating layer, (d) dividing the silicon layer into a first portion and a second portion, (e) removing a portion of the insulating layer so as to form an indentation thereon, (f) forming a piezoelectric layer on the first and the second portions of the silicon layer, and (g) forming at least an electrode on the piezoelectric layer.

Preferably, the second portion of the silicon layer is suspended above the indentation.

Preferably, the substrate is a silicon substrate.

Preferably, the insulating layer is a silica layer.

Preferably, in the step (d), the silicon layer is divided by an etched window formed thereon.

In accordance with the aspect, the step (d) further includes steps of (d1) applying a photoresist on the silicon layer, (d2) defining a position for the etched window by means of a lithography process, (d3) performing an etching process so as to form the etched window, and (d4) removing the photoresist.

Preferably, in the step (e), the portion of the insulating layer is removed with a hydrofluoric acid.

Preferably, in the step (f), the piezoelectric layer is formed by means of a chemical deposition process.

Preferably, in said step (f), the piezoelectric layer is formed by means of a physical deposition process.

Preferably, the electrode is a metallic and interdigital-shaped electrode.

In accordance with the aspect, the step (g) further includes steps of (g1) forming a metallic layer on the piezoelectric layer, and (g2) removing a portion of the metallic layer so as to form the electrode.

Preferably, in the step (g2), the portion of the metallic layer is removed by means of an etching process.

In accordance with the aspect, the step (g) further includes steps of (g1) forming a metallic layer on the piezoelectric layer, and (g2) lifting off the metallic layer so as to form the electrode.

It is a third aspect of the present invention to provide a method for fabricating a surface acoustic wave device. The method includes steps of (a) providing an SOI substrate with an insulating layer, (b) forming a silicon layer on the insulating layer, (c) forming an etched window on the silicon layer so as to divide the silicon layer into a first portion and a second portion, forming an indentation on the insulating layer, (e) forming a piezoelectric layer on the first and the second portions of the silicon layer, and (f) forming at least an electrode on the piezoelectric layer.

Preferably, the second portion of the silicon layer is suspended above the indentation.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIGS. 1(a) to 1(e), which are side views schematically illustrating the fabrication for a surface acoustic wave device according to a preferred embodiment of the present invention. In this embodiment, a suspended structure is formed on a silicon substrate, preferably a silicon-on-insulator (SOI) substrate, by means of the bulk micromachining process, and thereon a piezoelectric thin film is deposited. Subsequently, the piezoelectric film is patterned, so that an interdigital-shaped electrode and thus the layered surface acoustic wave (SAW) device with low velocity dispersion are fabricated.

Figure 1A:
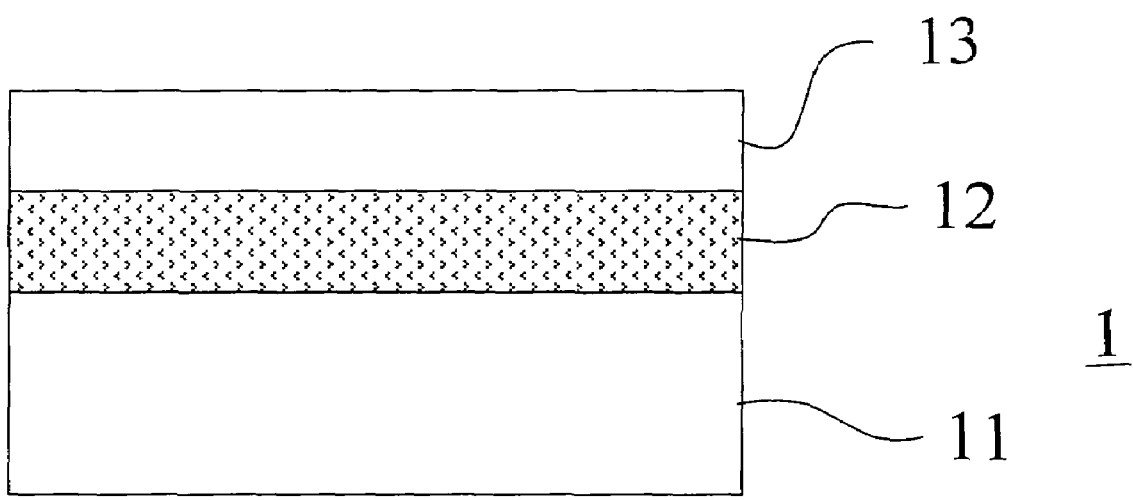
FIGS. 1(a) to 1(e) are side views schematically illustrating the fabrication for a surface acoustic wave device according to a preferred embodiment of the present invention.

As shown in FIG. 1(a), a silicon substrate 11 is provided. On the silicon substrate 11, an insulating layer 12, i.e. the silica layer, and a silicon layer 13 are formed in this sequence.

Figure 1B:
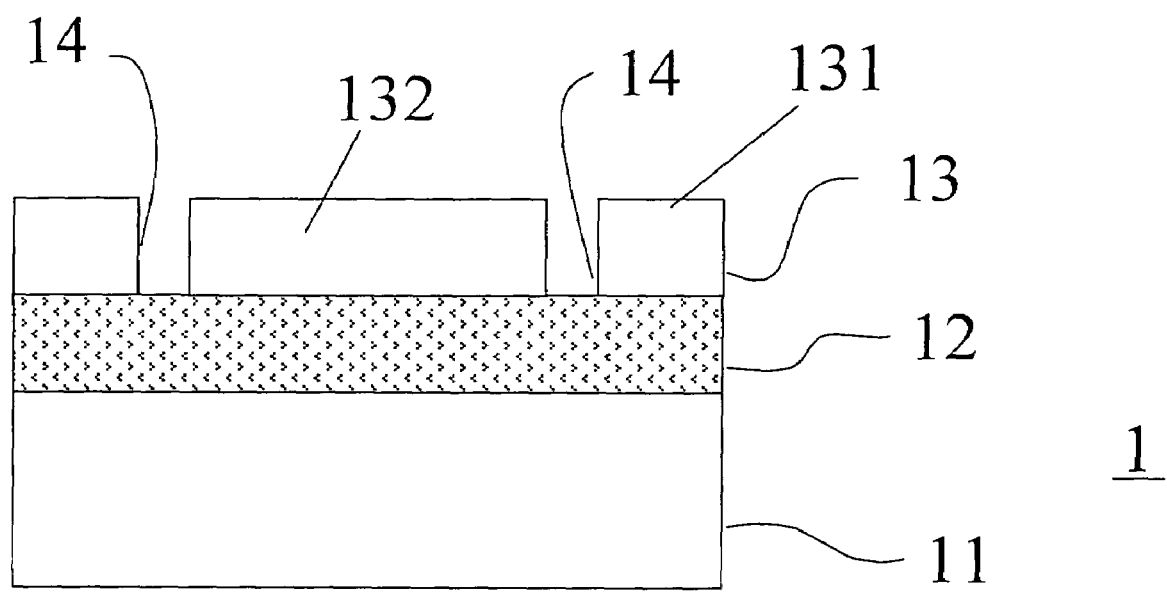

As shown in FIG. 1(b), then a photoresist layer is applied on the silicon layer 13, and the area for an etched window is defined thereon by means of the lithography process. Next, the etching process is performed to form the etched window 14 on the silicon layer 13, so as to divide the silicon layer 13 into a first portion 131 and a second portion 132. In a following step, the photoresist layer is removed.

Figure 1C:
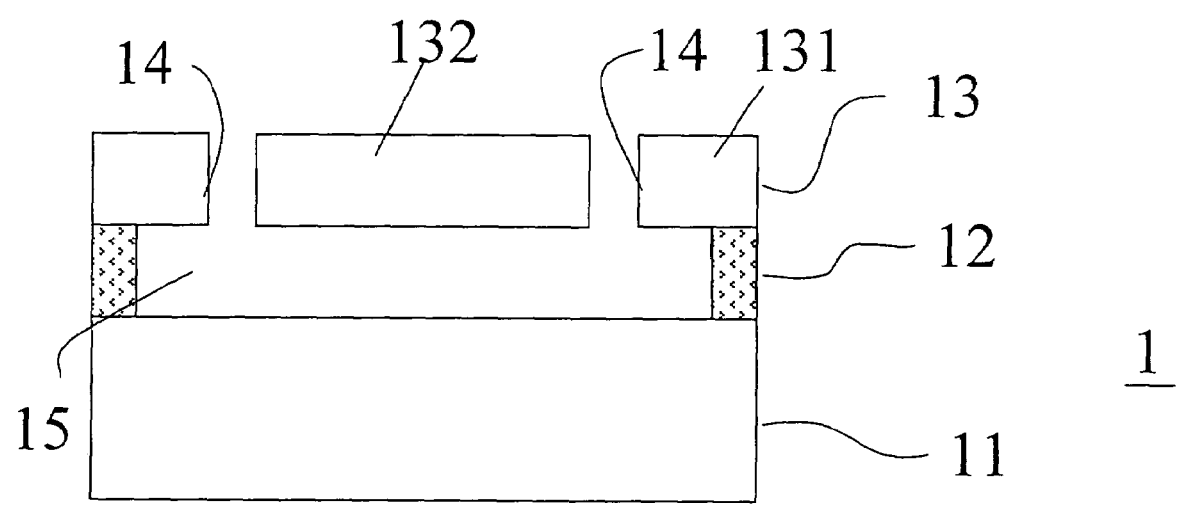

As shown in FIG. 1(c), the whole structure 1 is steeped in the hydrofluoric acid (HF) solution, so that the insulating layer 12 is removed due to the lateral etching with the HF solution. As a result, an indentation 15 is formed on the substrate 11, and the second portion 132 of the silicon layer 13 is suspended thereabove.

Figure 1D:
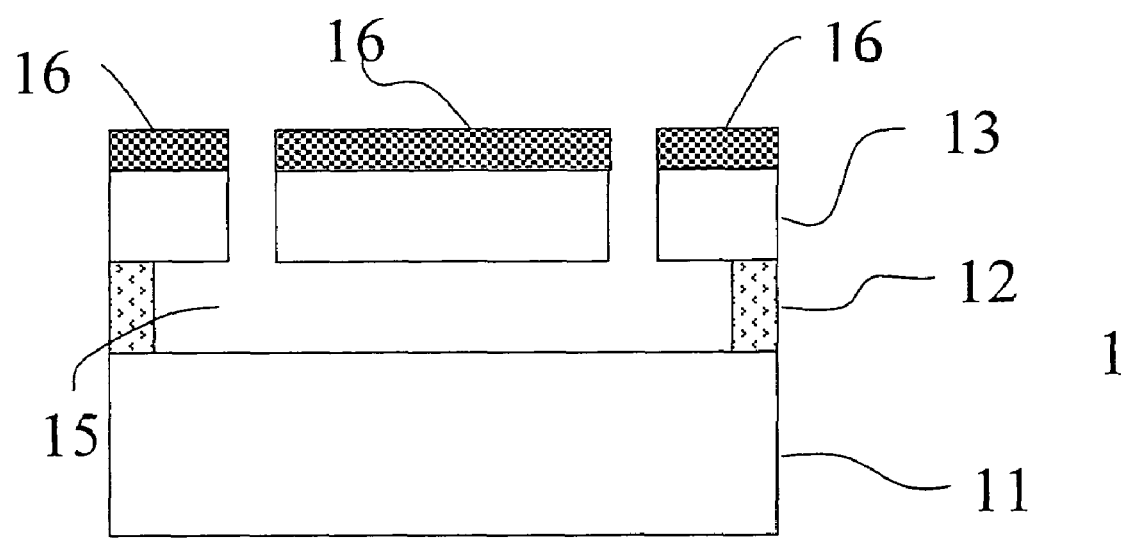

As shown in FIG. 1(d), a deposition process, preferably a chemical vapor deposition process and alternatively a physical deposition process, is subsequently performed, so as to deposit a piezoelectric thin film 16 on the first portion 131 as well as the second portion 132 of the silicon layer 13.

Figure 1E:
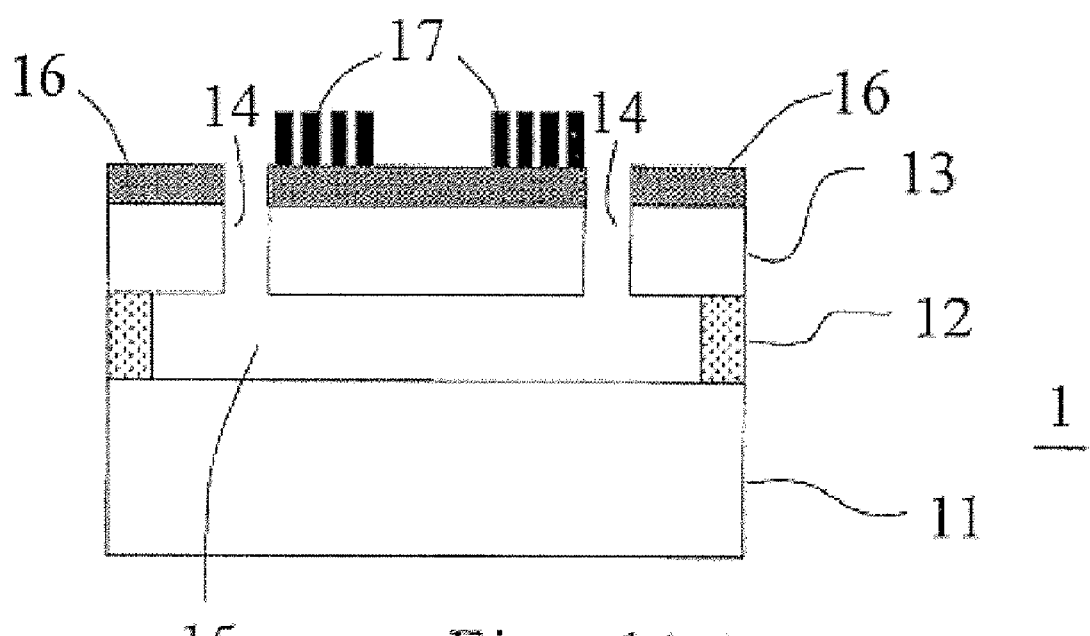

Finally, as shown in FIG. 1(e), a metal layer is deposited on the piezoelectric thin film 16, and the interdigital-shaped electrode 17 with a filtering characteristic is fabricated therefrom by means of the etching process or the lift-off process.

Figure 2:
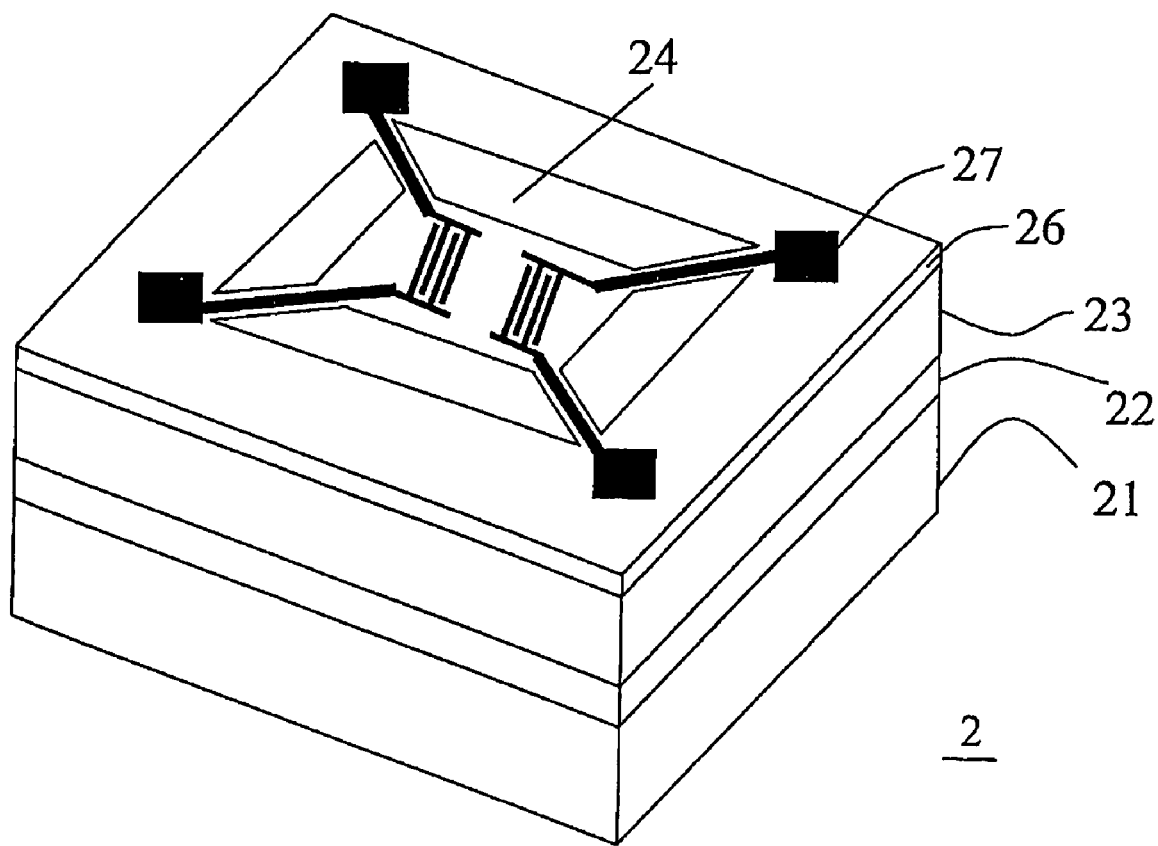
FIG. 2 is a schematic view showing the surface acoustic wave device according to the preferred embodiment of the present invention.

Please refer to FIG. 2, which is a schematic view showing the surface acoustic wave device according to the preferred embodiment of the present invention. As shown in FIG. 2, the SAW device 2 provided by the mentioned process includes a substrate 21, an insulating layer 22 with an indentation 24 on the substrate 21, a silicon layer 23 with a first portion on the insulating layer 22 and a second portion suspended above the indentation 24, a piezoelectric layer 26 on the first and the second portions of the silicon layer 23 and at least an interdigital-shaped electrode 27 on the piezoelectric layer.

In this invention, the thin film SAW device is fabricated by a novel method that is integrated with the bulk micromachining process. Because of the suspended structure, the provided thin film SAW device performs not only a reduced velocity dispersion but also a lower insertion loss. Besides, the superior piezoelectricity of the thin film SAW device also results in a higher applicable frequency therefor. Hence, the present invention not only has a novelty and a progressive nature, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A surface acoustic wave device comprising:
a substrate;
an insulating layer with an indentation on said substrate, wherein said indentation passes through said insulating layer without passing through said substrate;
a silicon layer with a first portion on said insulating layer and a second portion suspended above said indentation;
a piezoelectric layer having third and fourth portions on said first and said second portions of said silicon layer, respectively; and
at least a metallic and interdigital-shaped electrode having a fifth portion and a sixth portion on said third portion and said fourth portion, respectively, wherein said first portion, said third portion and said fifth portion are separated from said second portion, said fourth portion and said sixth portion by an etch window for suspending said second portion, said fourth portion and said sixth portion of said metallic and interdigital-shaped electrode sequentially disposed above said indentation.

2. The surface acoustic wave device according to claim 1, wherein said substrate is a silicon substrate.

3. The surface acoustic wave device according to claim 1, wherein said insulating layer is a silica layer.

* * * * *